United States Patent
Yang et al.

(10) Patent No.: US 9,520,517 B2
(45) Date of Patent: Dec. 13, 2016

(54) SOLAR CELL

(71) Applicant: LG Electronics Inc., Seoul (KR)

(72) Inventors: Hyunjin Yang, Seoul (KR); Heonmin Lee, Seoul (KR); Junghoon Choi, Seoul (KR); Kwangsun Ji, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 53 days.

(21) Appl. No.: 14/542,206

(22) Filed: Nov. 14, 2014

(65) Prior Publication Data

US 2015/0059849 A1    Mar. 5, 2015

Related U.S. Application Data

(63) Continuation of application No. 12/709,313, filed on Feb. 19, 2010, now abandoned.

(30) Foreign Application Priority Data

Sep. 14, 2009  (KR) .......................... 10-2009-0086418

(51) Int. Cl.
*H01L 31/0216*  (2014.01)
*H01L 31/0368*  (2006.01)
(Continued)

(52) U.S. Cl.
CPC ..... *H01L 31/0368* (2013.01); *H01L 31/02167* (2013.01); *H01L 31/022466* (2013.01);
(Continued)

(58) Field of Classification Search
CPC .. H01L 31/00; H01L 31/0248; H01L 31/0256; H01L 31/0352; H01L 31/036; H01L 31/0368; H01L 31/03685; H01L 31/0376; H01L 31/03765; H01L 31/03845
See application file for complete search history.

(56) References Cited

U.S. PATENT DOCUMENTS

| 4,594,261 A | 6/1986 | Ueno et al. |
| 2004/0043528 A1* | 3/2004 | Kruhler ............... H01L 31/1804 438/57 |

(Continued)

FOREIGN PATENT DOCUMENTS

| JP | 2003-282458 A | 10/2003 |
| JP | 2003-298077 A | 10/2003 |

(Continued)

OTHER PUBLICATIONS

Fujiwara et al., "Impact of epitaxial growth at the heterointerface of a-Si:H/c-Si solar cells", Applied Physics Letters, AIP, American Institute of Physics, Melville, NY, vol. 90, No. 1, Jan. 2, 2007, XP012093394.

(Continued)

*Primary Examiner* — Christina Chern
(74) *Attorney, Agent, or Firm* — Birch, Stewart, Kolasch & Birch, LLP (57) ABSTRACT

A solar cell including a non-amorphous semiconductor substrate of a first conductive type; at least a first semiconductor layer on the non-amorphous semiconductor substrate, the first semiconductor layer including a portion that is amorphous and a plurality of portions having crystal lumps, so that the plurality of portions having the crystal lumps are distributed in the first semiconductor layer; a first electrode on the semiconductor substrate; and a second electrode on the semiconductor substrate.

8 Claims, 10 Drawing Sheets

(51) Int. Cl.
  *H01L 31/068* (2012.01)
  *H01L 31/0747* (2012.01)
  *H01L 31/0224* (2006.01)
  *H01L 31/077* (2012.01)
(52) U.S. Cl.
  CPC .... *H01L 31/03682* (2013.01); *H01L 31/0682* (2013.01); *H01L 31/077* (2013.01); *H01L 31/0747* (2013.01); *Y02E 10/546* (2013.01); *Y02E 10/547* (2013.01)

(56) References Cited

U.S. PATENT DOCUMENTS

| | | |
|---|---|---|
| 2004/0200520 A1 | 10/2004 | Mulligan et al. |
| 2006/0130891 A1 | 6/2006 | Carlson |
| 2007/0169808 A1 | 7/2007 | Kherani et al. |
| 2008/0000521 A1 | 1/2008 | Sivoththaman et al. |
| 2008/0072953 A1 | 3/2008 | Stephens et al. |
| 2008/0092951 A1 | 4/2008 | Wang et al. |
| 2009/0317934 A1* | 12/2009 | Scherff ............. H01L 31/02242 438/72 |
| 2010/0147378 A1* | 6/2010 | Lee .................... H01L 31/1804 136/256 |

FOREIGN PATENT DOCUMENTS

| | | |
|---|---|---|
| JP | 2004-221142 A | 8/2004 |
| JP | 2008-85374 A | 4/2008 |
| JP | 2009-524916 A | 7/2009 |
| WO | WO 2008/037658 A2 | 4/2008 |
| WO | WO 2008/098407 A1 | 8/2008 |

OTHER PUBLICATIONS

Fujiwara et al.; ("Impact of expitaxial growth at the heterointerface of a-Si:H/c-Si solar cells"); Applied Physics Letters; vol. 90; pp. 013503-1-013503-3; 2007.

Kumar et al., "Effect of power on the growth of nanocrystalline silicon films", Journal of Physics: Condensed Matter, vol. 20, pp. 1-7 (2008).

Wang et al., "Effects of hydrogen dilution on deposition process of nano-crystalline silicon fim by SiCl4/H2 plasma", Journal of Physics D: Appl. Phys., vol. 39, pp. 3030-3035 (2006).

* cited by examiner

SOLAR CELL

This application is a Continuation application of co-pending U.S. patent application Ser. No. 12/709,313 filed on Feb. 19, 2010, which claims priority to and the benefit of Korean Patent Application No. 10-2009-0086418 filed in the Korean Intellectual Property Office on Sep. 14, 2009, all of which are hereby expressly incorporated by reference into the present application.

BACKGROUND OF THE INVENTION

Field of the Invention

Embodiments of the invention relate to a solar cell.

Discussion of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductor. The electron-hole pairs are separated into electrons and holes by a photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

The plurality of electrodes electrically connected to the emitter layer and the substrate collect the electrons and the holes moving to the emitter layer and the substrate and allow the electrons and the holes to move to a load connected to the outside.

However, in this case, because the electrode is formed on the emitter layer on a light incident surface of the substrate as well as a non-incident surface of the substrate, an incident area of light decreases. Hence, efficiency of the solar cell is reduced.

Accordingly, a back contact solar cell, in which all of electrodes collecting electrons and holes are positioned on a rear surface of a substrate, has been developed so as to increase an incident area of light.

SUMMARY OF THE INVENTION

In one aspect, there is a solar cell including a semiconductor substrate of a first conductive type, a first semiconductor layer of a second conductive type opposite the first conductive type on the semiconductor substrate, the first semiconductor layer including a crystal lump, a first electrode on the semiconductor substrate, the first electrode being electrically connected to the semiconductor substrate, and a second electrode on the semiconductor substrate, the second electrode being electrically connected to the first semiconductor layer.

The first semiconductor layer may have a crystallinity equal to or less than about 10%.

The solar cell may further include a second semiconductor layer of the first conductive type on the semiconductor substrate. The second semiconductor layer may include a crystal lump. The second semiconductor layer may have a crystallinity equal to or less than about 30%.

The solar cell may further include an intrinsic semiconductor layer on the semiconductor substrate. The intrinsic semiconductor layer may include a crystal lump. The intrinsic semiconductor layer may have a crystallinity equal to or less than about 10%.

The semiconductor substrate and the first semiconductor layer may form a hetero junction.

In another aspect, there is a solar cell comprising a substrate of a first conductive type, an emitter layer of a second conductive type opposite the first conductive type on the substrate, the emitter layer including a crystal lump, a first electrode electrically connected to the emitter layer, and a second electrode on the substrate, the second electrode being electrically connected to the substrate, wherein the substrate and the emitter layer form a hetero junction, wherein the emitter layer has a crystallinity equal to or less than about 10%.

The substrate may be formed of single crystal silicon or polycrystalline silicon, and the emitter layer may be formed of amorphous silicon.

The solar cell may further include a back surface field layer between the substrate and the second electrode. The back surface field layer may include a crystal lump. The back surface field layer may have a crystallinity greater than the crystallinity of the emitter layer. The crystallinity of the back surface field layer may be equal to or less than about 30%.

The solar cell may further include at least one passivation layer on the substrate. The at least one passivation layer may include a crystal lump. The at least one passivation layer may have a crystallinity equal to or less than about 10%. The at least one passivation layer may include a front passivation layer on a front surface of the substrate and a rear passivation layer on a rear surface of the substrate.

The emitter layer and the back surface field layer may be positioned on the rear surface of the substrate. The rear passivation layer may be positioned on the substrate between the emitter layer and the back surface field layer.

The emitter layer may be positioned on the front surface of the substrate, and the back surface field layer may be positioned on the rear surface of the substrate. The rear passivation layer may be positioned between the substrate and the back surface field layer.

The solar cell may further include a transparent conductive layer on the emitter layer and a conductive layer between the back surface field layer and the second electrode.

In another aspect, there is a solar cell Including a non-amorphous semiconductor substrate of a first conductive type; at least a first semiconductor layer on the non-amorphous semiconductor substrate, the first semiconductor layer including at least one portion that is crystalline and another portion that is amorphous; a first electrode on the semiconductor substrate; and a second electrode on the semiconductor substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Reference will now be made in detail to embodiments of the invention, examples of which are illustrated in the accompanying drawings.

First, referring to FIGS. 1 and 2, an example of solar cell according to an embodiment of the invention will be described.

Figure 1:
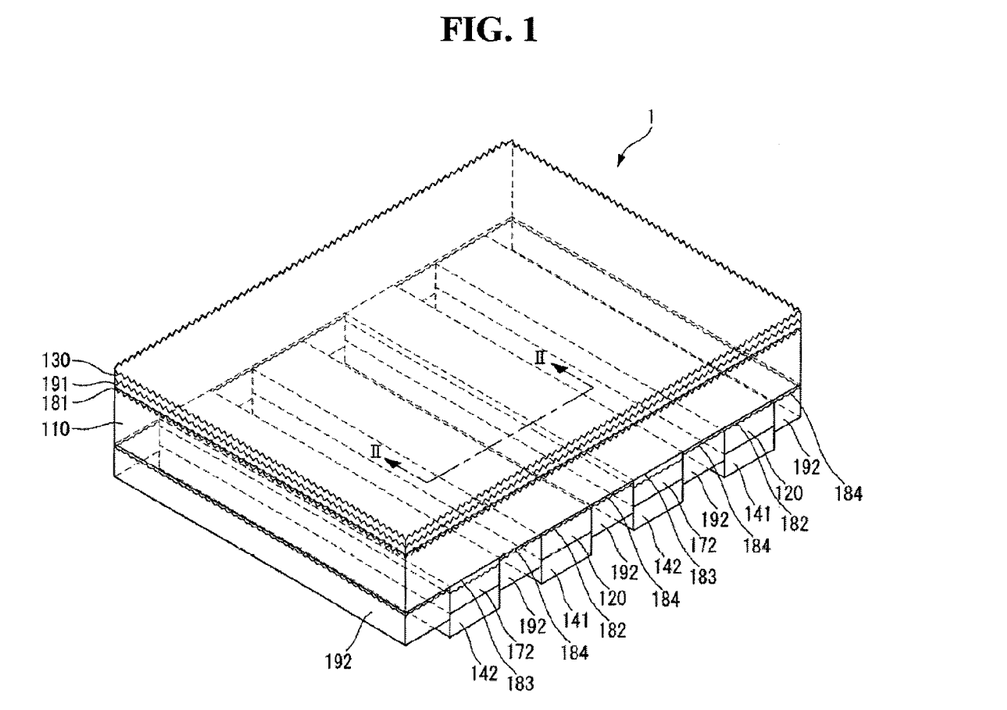
FIG. 1 is a partial perspective view of a solar cell according to an embodiment of the invention.

FIG. 1 is a partial perspective view of an example of a solar cell according to an embodiment of the invention. FIG. 2 is a cross-sectional view taken along line II-II of FIG. 1.

Figure 2:
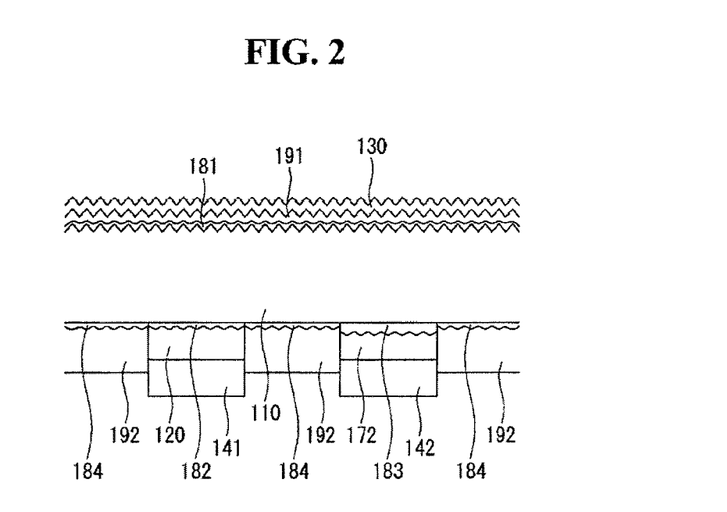
FIG. 2 is a cross-sectional view taken along the line II-II of FIG. 1.

As shown in FIGS. 1 and 2, a solar cell 1 according to an embodiment of the invention includes a substrate 110, a front passivation layer 191 on a front surface of the substrate 110 on which light is incident, an anti-reflection layer 130 on the front passivation layer 191, a plurality of emitter layers 120 on a rear surface of the substrate 110, opposite the front surface of the substrate 110, on which light is not incident, a plurality of back surface field (BSF) layers 172 that are positioned on the rear surface of the substrate 110 to be spaced apart from the plurality of emitter layers 120, a rear passivation layer 192 positioned between the plurality of emitter layers 120 and the plurality of BSF layers 172 on the rear surface of the substrate 110, a plurality of first electrodes 141 on the plurality of emitter layers 120, and a plurality of second electrodes 142 on the plurality of BSF layers 172.

The substrate 110 is a semiconductor substrate formed of first conductive type silicon, for example, n-type silicon, though not required. Silicon used in the substrate 110 is crystalline silicon, such as single crystal silicon and polycrystalline silicon. If the substrate 110 is of an n-type, the substrate 110 may contain impurities of a group V element, such as phosphor (P), arsenic (As), and antimony (Sb). Alternatively, the substrate 110 may be of a p-type, and/or be made of other materials than silicon. If the substrate 110 is of the p-type, the substrate 110 may contain impurities of a group III element, such as boron (B), gallium (Ga), and Indium (In).

The front surface of the substrate 110 is textured to form a textured surface corresponding to an uneven surface or having uneven characteristics.

The front passivation layer 191 on the textured surface of the substrate 110 converts defects, like a dangling bond, existing around the surface of the substrate 110 into stable bonds to reduce a recombination and/or a disappearance of carriers (e.g., holes) moving to the substrate 110 resulting from the defects.

The front passivation layer 191 is formed of amorphous silicon and is an intrinsic region.

The front passivation layer 191 includes a plurality of crystal lumps 181, each of which is comprised of polycrystals.

Each of the crystal lumps 181 is polycrystalline silicon obtained by performing an epitaxial growth on the front passivation layer 191 using crystalline silicon of the substrate 110 as a seed crystal. Most of the crystal lumps 181 are formed in a portion of the front passivation layer 191 adjoining the substrate 110.

In embodiments of the invention, the front passivation layer 191 includes regions or portions that are non-amorphous. Such non-amorphous regions or portions may be distributed in the portion of the front passivation layer 191 adjoining the substrate 110, such that the non-amorphous regions or portions may be referred to as the crystal lumps 181. One or more of the crystal lumps 181 may be present in the front passivation layer 191, and the crystal lumps 181 may form a crystalline sublayer or the crystalline sublayer may contain crystal lumps 181. In embodiments of the invention, the crystalline sublayer may be formed by the crystal lumps 181 being joined together in a continuous layer, but such is not required. In other embodiments, the crystal lumps 181 may be discontinuously distributed in the portion of the front passivation layer 191 adjoining the substrate 110.

The crystal lumps 181 collect electrons moving to the front passivation layer 191 to thereby cause a loss of carriers.

When crystal lumps being polycrystalline silicon are grown on a passivation layer formed of amorphous silicon based on a substrate formed of single crystal silicon, a relationship between carrier lifetime and crystallinity of the passivation layer is described with reference to FIG. 3. In the embodiment, the crystallinity indicates a percentage of a volume of polycrystalline silicon grown using the substrate 110 as a seed layer based on a total volume of a layer (e.g., the front passivation layer 191) formed on the substrate 110.

Figure 3:
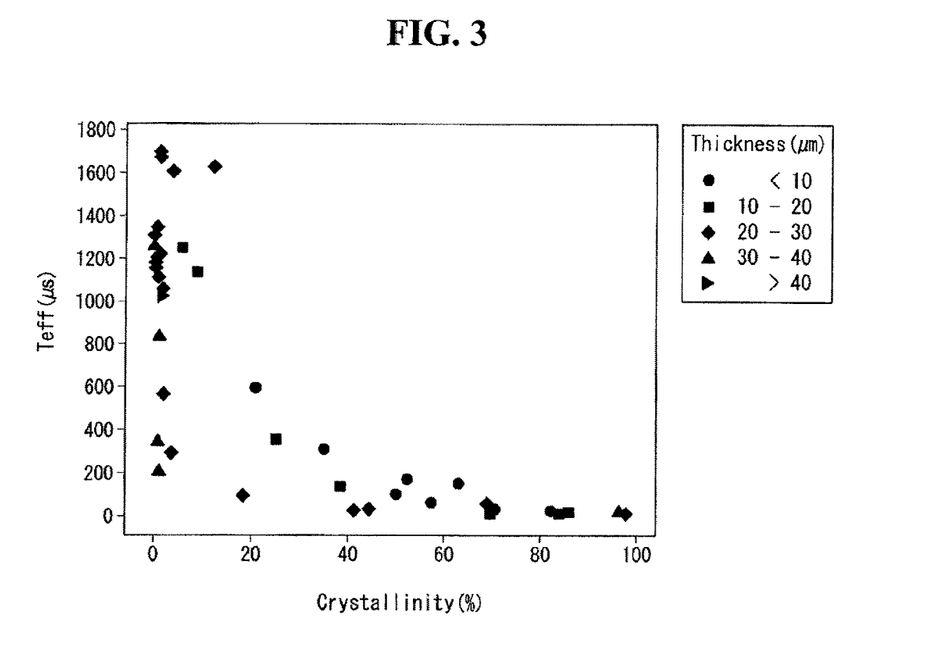
FIG. 3 is a graph measuring carrier lifetime depending on crystallinity of a front passivation layer formed of amorphous silicon when crystal lumps are grown on the front passivation layer using a substrate formed of single crystal silicon as a seed layer.

FIG. 3 is a graph measuring carrier lifetime depending on crystallinity of a front passivation layer formed of amorphous silicon when crystal lumps are grown on the front passivation layer using a substrate formed of single crystal silicon as a seed layer.

As shown in FIG. 3, as the crystallinity of the front passivation layer 191 is increased (i.e., as an amount of polycrystalline silicon grown on the front passivation layer 191 increased), lifetime Teff of carriers (e.g., holes) decreased. In other words, as an amount of grown polycrystalline silicon is increased, an amount of carriers that disappears by the grown polycrystalline silicon is increased.

However, when the crystallinity of the front passivation layer 191 was equal to or less than about 10%, lifetime Teff of charges (or holes) serving as minority carriers in the substrate 110 was held at a reference time (for example, was equal to or more than about 1 ms). In other words, the lifetime Teff of the charges greatly increased. In this case, the reference time is determined depending on a magnitude of an open-circuit voltage Voc. When the lifetime of minority carriers is equal to or more than about 1 ms, an open-circuit voltage capable of manufacturing a solar cell with high efficiency is obtained. As a result, when the lifetime of the minority carriers is equal to or more than about 1 ms, a solar cell with high efficiency can be manufactured. Regarding the lifetime Teff of minority carriers being a reference time, such a reference time need not be equal to or more than about 1 ms in embodiments of the invention. The lifetime Teff of minority carriers may be equal to or greater than about 0.1 ms (i.e., 100 µs), and may also be equal to or greater than 0.2 ms (i.e., 200 µs).

It could be understood from FIG. 3 that when the crystallinity of the front passivation layer 191 formed of amorphous silicon was equal to or greater than about 10%, the carrier lifetime decreased because of an increase in an amount of carriers disappeared by the grown polycrystalline silicon.

Accordingly, in the embodiment, an amount of carriers disappeared by grown polycrystalline silicon decreases by allowing the crystallinity of the front passivation layer 191 to be equal to or less than about 10%, and thus a reduction in the carrier lifetime is reduced or prevented. As a result, as the crystallinity of the front passivation layer 191 is close to about 0%, amorphization of the epitaxial grown polycrystalline silicon is accelerated. Hence, an amount of carriers that disappear decreases, and the efficiency of the solar cell 1 is improved.

Referring again to FIGS. 1 and 2, the anti-reflection layer 130 on the front passivation layer 191 is formed of silicon nitride (SiNx) or silicon oxide (SiOx), for example. The anti-reflection layer 130 reduces a reflectance of light incident on the solar cell 1 and increases a selectivity of a predetermined wavelength band. Hence, the efficiency of the solar cell 1 is improved. In the embodiment, the anti-reflection layer 130 has a single-layered structure. However, the anti-reflection layer 130 may have a multi-layered structure, such as a double-layered structure, and may be omitted if necessary.

The plurality of emitter layers 120 on the rear surface of the substrate 110 are formed of a semiconductor of a second conductive type (e.g., a p-type) opposite the first conductive type of the substrate 110, and the semiconductor (e.g., amorphous silicon) of the emitter layers 120 is different from the substrate 110. Thus, the emitter layer 120 and the substrate 110 form a hetero junction as well as a p-n junction.

As shown in FIG. 1, the plurality of emitter layers 120 are positioned substantially parallel to one another to be spaced apart from one another and extend in a predetermined direction.

If the emitter layers 120 are of a p-type, the emitter layers 120 may contain impurities of a group III element, such as boron (B), gallium (Ga), and Indium (In). On the contrary, if the emitter layers 120 are of an n-type, the emitter layers 120 may contain impurities of a group V element, such as phosphor (P), arsenic (As), and antimony (Sb).

Similar to the front passivation layer 191, each of the emitter layers 120 includes a plurality of crystal lumps 182, each of which is comprised of polycrystals.

As described above, each of the crystal lumps 182 is formed by epitaxial growing polycrystalline silicon on each of the emitter layers 120 using the substrate 110 formed of crystalline silicon as a seed layer. Most of the crystal lumps 182 are formed in a portion of each emitter layer 120 adjoining the substrate 110.

In embodiments of the invention, the emitter layers 120, being an amorphous silicon layer, includes regions or portions that are non-amorphous. Such non-amorphous regions or portions may be distributed in the portion of the emitter layers 120 adjoining the substrate 110, such that the non-amorphous regions or portions may be referred to as the crystal lumps 182. One or more of the crystal lumps 182 may be present in the emitter layers 120, and the crystal lumps 182 may form a crystalline sublayer or the crystalline sublayer may contain crystal lumps 182. In embodiments of the invention, the crystalline sublayer may be formed by the crystal lumps 182 being joined together in a continuous layer, but such is not required. In other embodiments, the crystal lumps 182 may be discontinuously distributed in the portion of the emitter layers 120 adjoining the substrate 110.

When crystal lumps are grown on the emitter layer 120 formed of amorphous silicon using the substrate 110 formed of single crystal silicon as a seed layer, a relationship between carrier lifetime and crystallinity of the emitter layer 120 is described with reference to FIG. 4.

Figure 4:
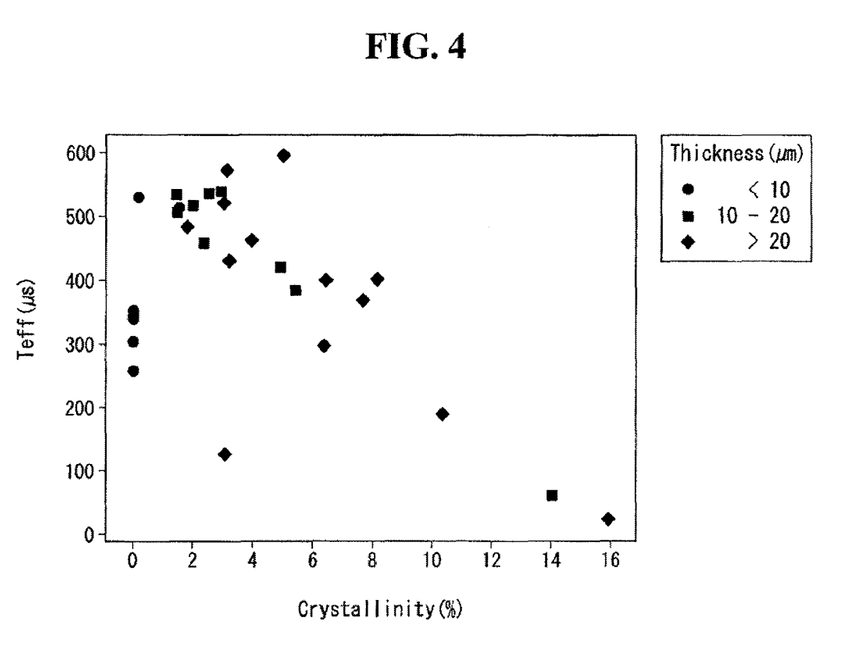
FIG. 4 is a graph measuring carrier lifetime depending on crystallinity of an emitter layer formed of amorphous silicon when crystal lumps are grown on the emitter layer using a substrate formed of single crystal silicon as a seed layer.

FIG. 4 is a graph measuring carrier lifetime depending on crystallinity of an emitter layer formed of amorphous silicon when crystal lumps are grown on the emitter layer using a substrate formed of single crystal silicon as a seed layer.

As shown in FIG. 4, when the emitter layer 120 had crystallinity equal to or less than about 10%, carrier lifetime Teff was equal to or more than about 0.2 ms corresponding to a reference time. When the crystallinity of the emitter layer 120 was greater than about 10%, the carrier lifetime Teff was equal to or less than about 0.2 ms.

It could be understood from FIG. 4 that when the crystallinity of the emitter layer 120 formed of amorphous silicon was equal to or less than about 10%, the carrier lifetime was equal to or more than the reference time capable of manufacturing a hetero junction solar cell with high efficiency.

Accordingly, in the embodiment, each of the emitter layers 120 has the crystallinity equal to or less than about 10% so as to reduce carrier disappearance resulting from the grown crystal lumps 182.

Referring again to FIGS. 1 and 2, the plurality of BSF layers 172 on the rear surface of the substrate 110 are separated from the plurality of emitter layers 120 and extend substantially parallel to one another in the same direction as the emitter layers 120. Thus, the plurality of emitter layers 120 and the plurality of BSF layers 172 are alternately positioned on the rear surface of the substrate 110.

The BSF layers 172 are formed of amorphous silicon and are a region (e.g., an n+-type region) that is more heavily doped with impurities of the same conductive type as the substrate 110 than the substrate 110.

Holes moving to the rear surface of the substrate 110 are reduced or prevented from moving to the second electrodes 142 because of a potential barrier resulting from a difference between impurity doping concentrations of the substrate 110 and the BSF layer 172. Therefore, a recombination and/or a disappearance of the electrons and holes are reduced around the second electrodes 142.

Because the BSF layers 172 on the substrate 110 formed of crystalline silicon are formed of amorphous silicon, each of the BSF layers 172 includes a plurality of crystal lumps 183, each of which is comprised of polycrystals. As described above, each of the crystal lumps 183 is formed by epitaxial growing polycrystalline silicon on each of the BSF layers 172 using the substrate 110 as a seed layer.

In embodiments of the invention, the BSF layers 172, being an amorphous silicon layer, includes regions or portions that are non-amorphous. Such non-amorphous regions or portions may be distributed in the portion of the BSF layers 172 adjoining the substrate 110, such that the non-amorphous regions or portions may be referred to as the crystal lumps 183. One or more of the crystal lumps 183 may be present in the BSF layers 172, and the crystal lumps 183 may form a crystalline sublayer or the crystalline sublayer may contain crystal lumps 183. In embodiments of the invention, the crystalline sublayer may be formed by the crystal lumps 183 being joined together in a continuous layer, but such is not required. In other embodiments, the crystal lumps 183 may be discontinuously distributed in the portion of the BSF layers 172 adjoining the substrate 110.

When crystal lumps are grown on the BSF layers 172 formed of amorphous silicon based on the substrate 110 formed of single crystal silicon, a relationship between carrier lifetime and crystallinity of the BSF layers 172 is described with reference to FIG. 5.

Figure 5:
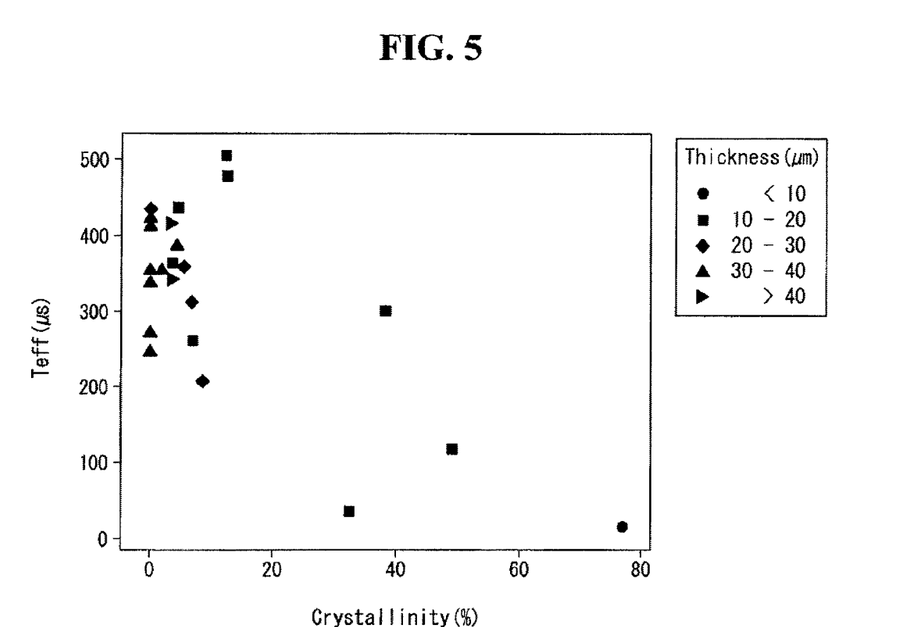
FIG. 5 is a graph measuring carrier lifetime depending on crystallinity of a back surface field (BSF) layer formed of amorphous silicon when crystal lumps are grown on the BSF layer using a substrate formed of single crystal silicon as a seed layer.

FIG. 5 is a graph measuring carrier lifetime depending on crystallinity of a BSF layer formed of amorphous silicon when crystal lumps are grown on the BSF layer using a substrate formed of single crystal silicon as a seed layer.

As shown in FIG. 5, when the BSF layers 172 had crystallinity equal to or less than about 30%, carrier lifetime Teff was equal to or more than about 0.1 ms corresponding to a reference time. When the crystallinity of the BSF layers 172 was greater than about 30%, the carrier lifetime Teff was equal to or less than about 0.1 ms.

Accordingly, in the embodiment, each of the BSF layers 172 has the crystallinity equal to or less than about 30% so as to reduce carrier disappearance resulting from the grown crystal lumps 183.

The BSF layers 172 of the same conductive type as the substrate 110 have the crystallinity greater than the crystallinity of the emitter layers 120 of the conductive type opposite the conductive type of the substrate 110. This reason is as follows.

In the embodiment, the BSF layers 172 of the same conductive type (i.e., the n-type) as the substrate 110 contain a group V element as a dopant. Because one electron of the group V element is released so that the group V element combines with silicon of the substrate 110 adjoining the BSF layers 172, fixed charges of atoms existing in the surface of the BSF layer 172 have a positive (+) value. As a result, because the fixed charges of the BSF layers 172 have the same positive value as holes serving as minority carrier in the substrate 110, the movement of holes to the BSF layers 172 is disturbed because of electrical repellent force.

On the contrary, the emitter layers 120 of the conductive type opposite the conductive type of the substrate 110 contain a group III element as a dopant. Because the group III element obtains one electron so that the group III element combines with silicon of the substrate 110 adjoining the emitter layers 120, fixed charges of atoms existing in the surface of the emitter layers 120 have a negative (−) value. As a result, because the fixed charges of the emitter layers 120 have the negative (−) value opposite the positive (+) value of the holes, the movement of holes to the emitter layers 120 is accelerated.

Because of the above-described reason, an amount of the minority carriers disappeared by epitaxial grown polycrystalline silicon when a semiconductor material of the same conductivity type as the substrate 110 is positioned on the substrate 110 is less than an amount of the minority carriers disappeared by epitaxial grown polycrystalline silicon when a semiconductor material of a conductivity type opposite the conductivity type of the substrate 110 is positioned on the substrate 110. Accordingly, the crystallinity of the BSF layers 172 of the same conductivity type as the substrate 110 may be greater than the crystallinity of the emitter layers 120 of the conductivity type opposite the conductivity type of the substrate 110.

A plurality of electron-hole pairs produced by light incident on the substrate 110 are separated into electrons and holes by a built-in potential difference resulting from the p-n junction formed by the substrate 110 and the emitter layers 120. Then, the separated electrons move to an n-type semiconductor, and the separated holes move to a p-type semiconductor. Thus, when the substrate 110 is the n-type semiconductor and the emitter layers 120 are the p-type semiconductors, the separated holes move to the emitter layers 120 and the separated electrons move to the BSF layers 172 whose impurity doping concentration is greater than the impurity doping concentration of the substrate 110.

Because each of the emitter layers 120 forms the p-n junction together with the substrate 110, the emitter layers 120 may be of the n-type if the substrate 110 is of the p-type unlike the embodiment described above. In this case, the separated electrons move to the emitter layers 120 and the separated holes move to the BSF layers 172.

The rear passivation layer 192 between the plurality of emitter layers 120 and the plurality of BSF layers 172 is formed of a non-conductive material such as amorphous silicon in the same manner as the front passivation layer 191. The rear passivation layer 192 converts defects, like a dangling bond, existing around the surface of the substrate 110 into stable bonds to reduce a recombination and/or a disappearance of carriers (e.g., electrons) moving to the rear surface of the substrate 110 resulting from the defects and prevents an electric interference between the first and second electrodes 141 and 142.

The rear passivation layer 192 includes a plurality of epitaxial grown crystal lumps 184 that are mostly formed in a portion of the rear passivation layer 192 adjoining the substrate 110, in the same manner as the front passivation layer 191. Accordingly, discussion of the crystalline sublayer with regard to the front passivation layer 191 applies also to the rear passivation layer 192.

Because the crystal lumps 184 have the same carrier lifetime characteristic as FIG. 3 in the same manner as the crystal lumps 181, the rear passivation layer 192 has crystallinity equal to or less than about 10%.

The plurality of first electrodes 141 respectively on the plurality of emitter layers 120 extend along the emitter layers 120 and are electrically connected to the emitter layers 120. Each of the first electrodes 141 collects carriers (e.g., holes) moving to the corresponding emitter layer 120.

The plurality of second electrodes 142 respectively on the plurality of BSF layers 172 extend along the BSF layers 172 and are electrically connected to the BSF layers 172. Each of the second electrodes 142 collects carriers (e.g., electrons) moving to the corresponding BSF layers 172.

The first electrodes 141 and the second electrodes 142 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

In the solar cell 1 according to the embodiment of the invention having the above-described structure, the plurality of first electrodes 141 and the plurality of second electrodes 142 are positioned on the rear surface of the substrate 110 on which light is not incident, and the substrate 110 and the plurality of emitter layers 120 are formed of different conductive types of semiconductors. An operation of the solar cell 1 is described below.

When light irradiated to the solar cell 1 sequentially passes through the anti-reflection layer 130 and the front passivation layer 191 and then is incident on the substrate 110, a plurality of electron-hole pairs are generated in the substrate 110 by light energy based on the incident light. In this case, because the front surface of the substrate 110 is a textured surface, a light reflectance in the front surface of the substrate 110 is reduced. Further, because both a light incident operation and a light reflection operation are performed on the textured surface, a light absorptance increases. Hence, the efficiency of the solar cell 1 is improved. In addition, because a reflection loss of light incident on the substrate 110 is reduced by the anti-reflection layer 130, an amount of light incident on the substrate 110 further increases.

The electron-hole pairs are separated by the p-n junction of the substrate 110 and the emitter layer 120. Then, the separated holes move to the p-type emitter layers 120, and the separated electrons move to the n-type BSF layers 172. The holes and the electrons are collected by the first electrodes 141 and the second electrodes 142. When the first electrodes 141 are connected to the second electrodes 142 using electric wires (not shown), current flows therein to thereby enable use of the current for electric power.

In the embodiment, because a loss of carriers resulting from the crystal lumps 181 to 184 is reduced by controlling the crystallinity of each of the components 191, 120, 172, and 192 adjoining the substrate 110, the efficiency of the solar cell 1 is improved. Also, in embodiments of the invention, the crystallinity of the n-type BSF layers 172 is greater than the crystallinity of the p-type the emitter layers 120, when the substrate 110 is n-type. Accordingly, a crystallinity of a layer having the same conductivity type as a conductivity of the substrate may be greater than a crystallinity of a layer having a different conductivity type from the conductivity of the substrate.

Next, referring to FIGS. 6 to 10, other examples of the solar cell according the embodiment of the present invention will be described.

Figure 6:
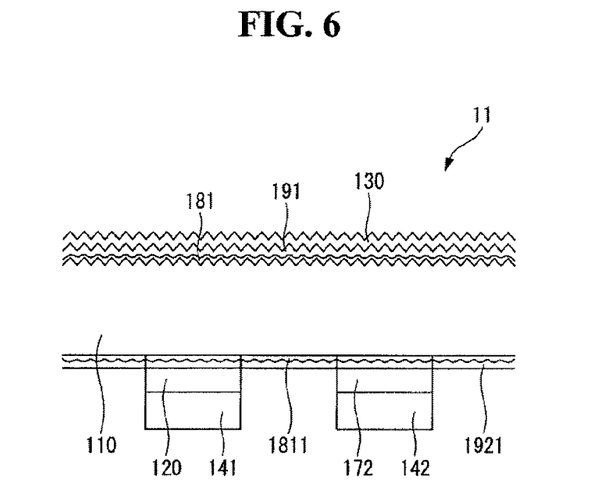
FIGS. 6 to 10 are cross-sectional views of other examples of a solar cell according an embodiment of the present invention, respectively.
Figure 9:
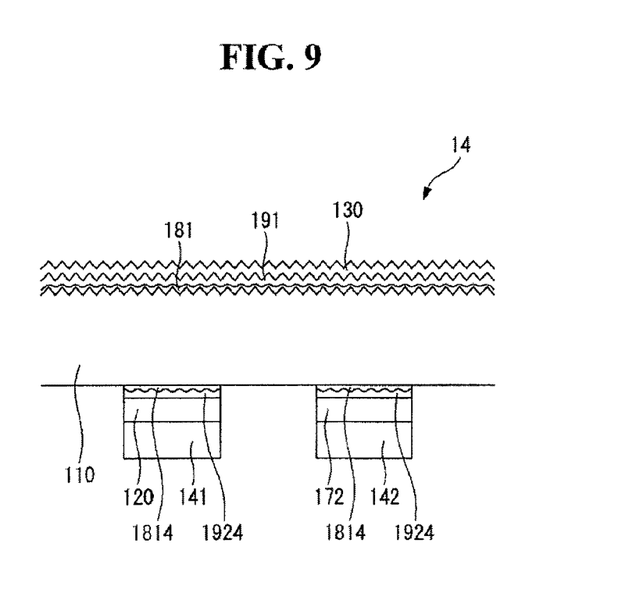
Figure 10:
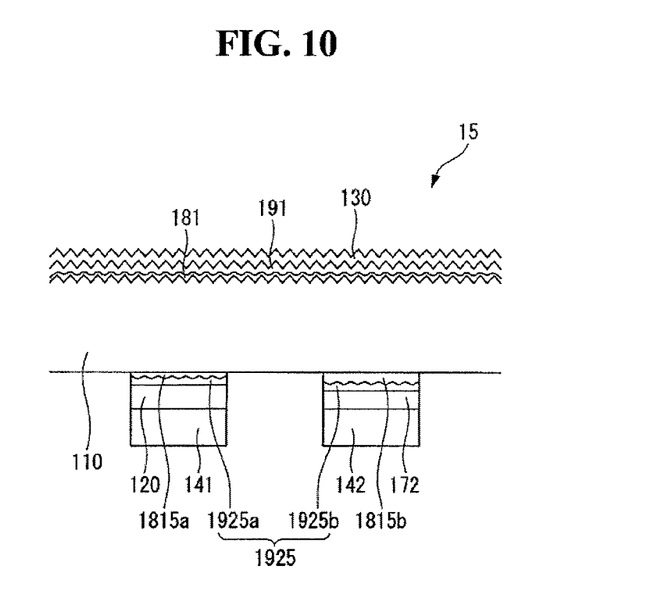

FIGS. 6 and 10 are cross-sectional views of other examples of a solar cell according an embodiment of the present invention, respectively.

In comparing solar cells 11 to 15 shown in FIGS. 6 to 10 to the solar cell 1 shown in FIGS. 1 and 2, except a formation position of a rear passivation layer and the crystallinity of the rear passivation layer, a plurality of emitter layers and a plurality of BSF layers, the solar cells 11 to 15 have the same structures as the solar cell 1. Thereby, as compared with FIGS. 1 and 2, the elements performing the same operations are indicated as the same reference numerals, and the detailed description thereof is omitted. In addition, a partial perspective view of each solar cell 11 to 15 is omitted.

In the solar cell 11 shown in FIG. 6, the rear passivation 1921 is an intrinsic region made of amorphous silicon and is positioned on the entire rear surface of the substrate 110. The plurality of emitter layers 120 and the plurality of BSF layers 172 are spaced apart from each other and positioned on the rear passivation layer. The rear passivation layer 1921 has a thickness not to prevent the movement charges moving to the emitter layers 120 and the BSF layers 172.

As above-described referring to FIGS. 1 and 2, the rear passivation layer 1921 converts defects existing around the surface of the substrate 110 into stable bonds to reduce a recombination and/or a disappearance of charges moving to the rear surface of the substrate 110 resulting from the defects. At this time, since the rear passivation layer 1921 is positioned on the entire rear surface of the substrate 110, an amount of the recombination and/or disappearance of charges is largely reduced and a current leakage phenomenon between the first and second electrodes 141 and 142 is prevented or decreased.

The rear passivation layer 1921 includes a plurality of crystal lumps 1811 that are epitaxy grown and have crystallinity equal to or less than about 10% like the rear passivation layer 192 shown in FIGS. 1 and 2.

Figure 7:
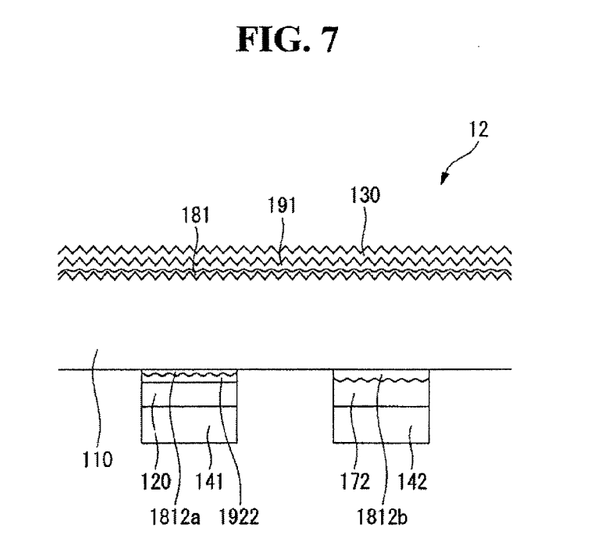

In the solar cell 12 shown in FIG. 7, the rear passivation layer 1922 is positioned between the plurality of emitter layers 120 and the substrate 110, but does not exist between the plurality of BSF layers 172 and the substrate 110 and on exposed portions of the substrate 110. Similar to FIG. 6, the rear passivation layer 1922 has a thickness not to prevent the movement of charges moving to the emitter layers 120. Thereby, an amount of the recombination and/or disappearance of charges on an interface between the emitter layers 120 and the substrate 110 is reduced to increase an amount of charges moving to each emitter layer 120.

The rear passivation layer 1922 and the BSF layers 172 include a plurality of crystal lumps 1812a and 1812b which grown to polycrystals. At this time, as described referring to FIGS. 1 and 2, crystallinity of the rear passivation layer 1922 is equal to or less than about 10% and crystallinity of the BSF layers 142 is equal to or less than about 30%.

Figure 8:
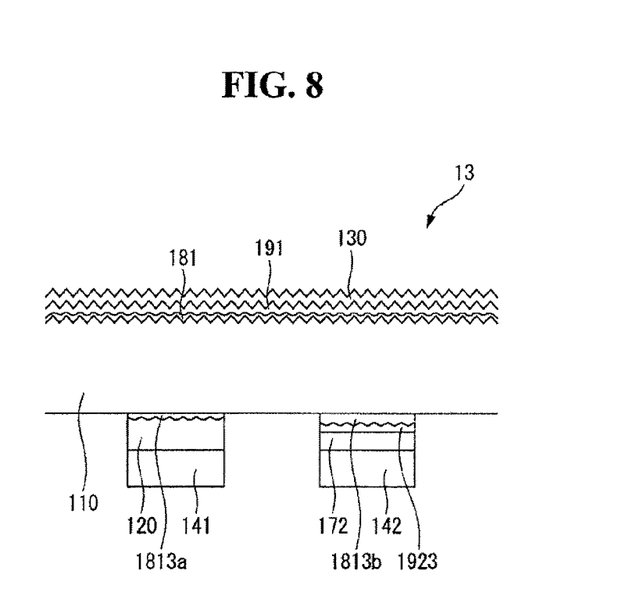

In the solar cell 13 shown in FIG. 8, unlike the solar cell 12 shown in FIG. 7, the rear passivation layer 1923 is positioned between the plurality of BSF layers 172 and the substrate 110. The rear passivation layer 1923 also has a thickness not to prevent the movement of charges moving to the BSF layers 170. Thereby, an amount of the recombination and/or disappearance of charges on an interface between the BSF layers 172 and the substrate 110 is reduced to increase an amount of charges moving to each BSF layer 172.

The rear passivation layer 1923 and the emitter layers 120 have crystal lumps 1813a and 1813b which are grown to polycrystals. At this time, as described referring to FIGS. 1 and 2, each of the emitter layers 120 has crystallinity equal to or less than of about 10%. However, since the BSF layers 172 are positioned on the rear passivation layer 1923 and each of the BSF layers 172 have the crystallinity more than the crystallinity of the front passivation layer 191 and each emitter layer 120 described based on FIG. 5, the rear passivation layer 1923 underlying the BSF layers 172 has crystallinity equal to or less than about 30%.

In the solar cells 14 and 15 shown in FIGS. 9 and 10, respectively, the rear passivation layers 1924 and 1925 exist between the substrate 110 and the plurality of emitter layers 120 and between the substrate 110 and the plurality of BSF layers 172. The rear passivation layers 1924 and 1925 also have thicknesses not to prevent the movement of charges moving to the emitter layers 120 and the BSF layers 170, respectively. Thereby, an amount of the recombination and/or disappearance of charges on interfaces between the emitter layers 120 and the substrate 110 and between the BSF layers 172 and the substrate 110 is reduced to increase an amount of charges moving to each of the emitter layers 120 and the BSF layers 172.

The rear passivation layers 1924 and 1925 of FIGS. 9 and 10 have a plurality of crystal lumps 1814, 1815a and 1815b that are grown to polycrystals, respectively, but the rear passivation layers 1924 and 1925 have different crystallinity from each other.

That is, in FIG. 9, the rear passivation layer 1924 positioned under the emitter layers 120 and the rear passivation layer 1924 positioned under the BSF layers 172 have the same crystallinity as each other, and, for example, have crystallinity equal to or less than about 10%. In this case, the rear passivation layer 1924 is formed on the entire rear surface of the substrate 110 and etched to remove portions of the rear passivation layer 1924. The emitter layers 120 and the BSF layers 172 are formed on the remaining portions of the rear passivation 1924. Since the rear passivation layer 1924 underlying the emitter layers 120 and the BSF layers 172 is formed at the same time, the rear passivation layer 1924 have the same crystallinity.

However, the solar cell 15 shown in FIG. 10, the rear passivation layer 1925a underlying the emitter layers 120 and the rear passivation layer 1925b underlying the BSF layers 120 have different crystallinity from each other.

For example, the rear passivation layer 1925a underlying the emitter layers 120 has crystallinity of equal to or less than about 10% and the rear passivation layer 1925b underlying the BSF layers 172 has crystallinity equal to or less than about 30%. At this time, the rear passivation layer 1925a and the rear passivation layer 1925a are separately formed, and then the emitter layers 120 and the BSF layers 172 are formed on the rear passivation layers 1925a and 1925b, respectively. Thereby, the rear passivation layer 1925a has the crystallinity of about 10% or less due to the influence of the emitter layers 120 positioned thereon and the rear passivation layer 1925b has the crystallinity of about 30% or less than due to the influence of the BSF layers 172 positioned thereon.

Accordingly, because a loss of carriers resulting from the crystal lumps 1811, 1812a, 1812b, 1813a, 1814, 1815a and 1815b is reduced by controlling the crystallinity of each of the rear passivation layers 1921-1925, the efficiency of the solar cells 11-15 is improved.

A solar cell according to another embodiment of the invention is described below with reference to FIGS. 11 and 12.

Figure 11:
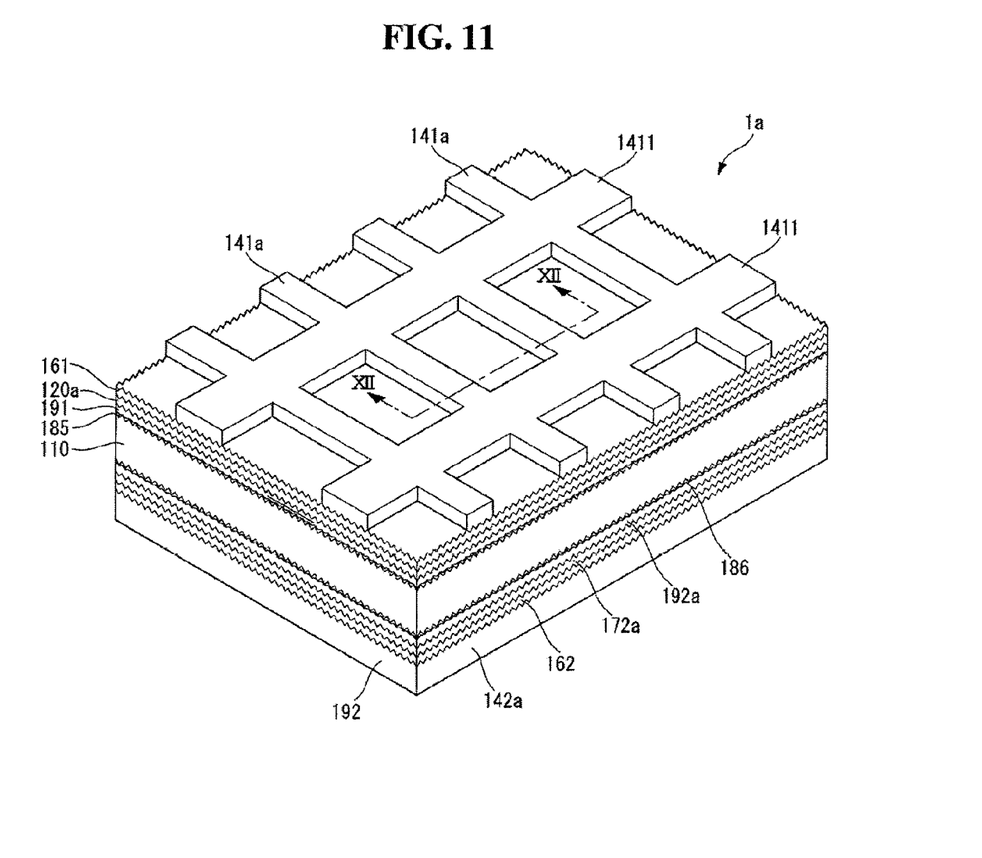
FIG. 11 is a partial perspective view of a solar cell according to another embodiment of the invention.

FIG. 11 is a partial perspective view of a solar cell according to another embodiment of the invention. FIG. 12 is a cross-sectional view taken along the line XII-XII of FIG. 11. In the following explanations, structural elements having the same functions and structures as those illustrated in FIGS. 1 and 2 are designated by the same reference numerals, and a further description may be briefly made or may be entirely omitted.

Figure 12:
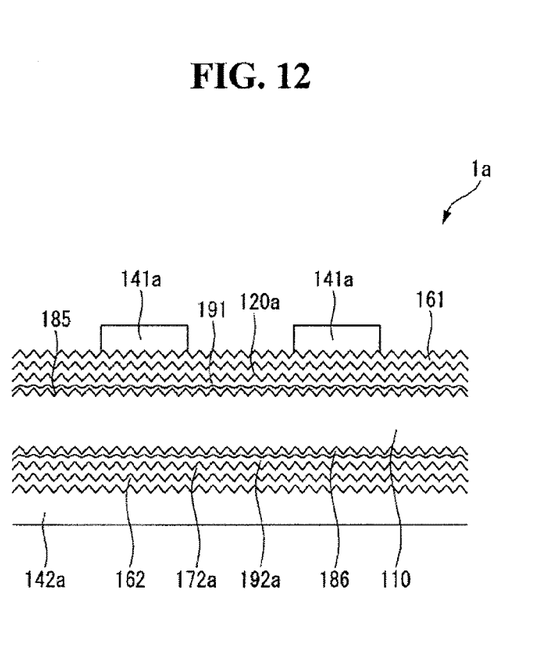
FIG. 12 is a cross-sectional view taken along the line XII-XII of FIG. 11.

As shown in FIGS. 11 and 12, a solar cell 1a includes a substrate 110 formed of crystalline silicon, a front passivation layer 191 on a front surface of the substrate 110, an emitter layer 120a on the front passivation layer 191, a transparent conductive layer 161 on the emitter layer 120a, a plurality of first electrodes 141a on the transparent conductive layer 161, at least one electrode current collector 1411 that is positioned on the transparent conductive layer 161 and extend in a direction crossing the front electrodes 141a, a rear passivation layer 192a on a rear surface of the substrate 110, a back surface field (BSF) layer 172a on the rear passivation layer 192a, a conductive layer 162 on the BSF layer 172a, and a second electrode 142a on the conductive layer 162.

In the solar cell 1a shown in FIGS. 11 and 12, the emitter layer 120a that is electrically connected to the substrate 110 and formed of amorphous silicon is formed substantially entirely on a front surface of the substrate 110 (i.e., a light incident surface of the solar cell 1a) when compared with the solar cell 1 shown in FIGS. 1 and 2. Further, the emitter layer 120a is positioned opposite the second electrode 142a on the rear surface of the substrate 110 with the substrate 110 interposed between the emitter layer 120a and the second electrode 142a. Hence, the second electrode 142a is formed substantially entirely on the rear surface of the substrate 110, and also the BSF layer 172a between the substrate 110 and the second electrode 142a is formed substantially entirely on the rear surface of the substrate 110.

In the solar cell 1a, because the front surface and the rear surface of the substrate 110 are textured unlike the solar cell 1 shown in FIGS. 1 and 2, a separate process for removing a texturing pattern on the rear surface of the substrate 110 is not necessary.

Further, the rear passivation layer 192a is formed substantially entirely on the rear surface of the substrate 110, i.e., between the substrate 110 and the BSF layer 172a. Thus, carriers moving to the rear surface of the substrate 110 pass through the rear passivation layer 192a to move to the BSF layer 172a. A thickness of the rear passivation layer 192a may be less than a thickness of the rear passivation layer 192 shown in FIGS. 1 and 2, so as to easily move the carriers. For example, the thickness of the rear passivation layer 192a may be approximately 1 μm to 10 μm.

As described above, the solar cell 1a shown in FIGS. 11 and 12 further includes the transparent conductive layer 161 directly on the emitter layer 120a and the conductive layer 162 between the BSF layer 172a and the second electrode 142a, unlike the solar cell 1 shown in FIGS. 1 and 2. Hence, the plurality of first electrodes 141a are positioned on a portion of the transparent conductive layer 161 to be electrically connected to the emitter layer 120 through the transparent conductive layer 161, and the second electrode 142a is electrically connected to the substrate 110 through the conductive layer 162.

The transparent conductive layer 161 is a conductive layer based on an oxide layer and collects carriers (e.g., holes) moving to the emitter layer 120a to transfer the carriers to the first electrodes 141a. In addition, the transparent conductive layer 161 may serve as an anti-reflection layer. For the above-described operation, the transparent conductive layer 161 needs to have a high light transmittance capable of transmitting most of incident light and high electrical conductivity for a good flow of carriers. Thus, the transparent conductive layer 161 may be formed of material selected from the group consisting of indium tin oxide (ITO), tin-based oxide (e.g., SnO2), AgO, ZnO—Ga2O3 (or Al2O3), fluorine tin oxide (FTO), and a combination thereof. Other materials may be used.

The at least one electrode current collector 1411 is positioned at the same level as the first electrodes 141a and is electrically connected to the first electrodes 141a. The at least one electrode current collector 1411 collects carriers received from the first electrodes 141a to output the carriers to an external device. In this embodiment, the conductive layer 161, the first electrode 141a and the electrode current collector 1411 form a front electrode portion or a first electrode portion.

The conductive layer 162 increases an adhesive strength between the BSF layer 172a formed of silicon and the second electrode 142a formed of a conductive material containing a metal component to increase a carrier transfer rate from the BSF layer 172a to the second electrode 142a. Further, the conductive layer 162 again reflects light passing through the substrate 110 from the substrate 110 to improve the efficiency of the solar cell 1a. The conductive layer 162 may be formed of a transparent conductive material, such as ITO and ZnO. Other materials may be used. In this embodiment, the conductive layer 162 and the second electrode 142a form a rear electrode portion or a second electrode portion.

The emitter layer 120a formed of amorphous silicon and the rear passivation layer 192a, each of which adjoins the substrate 110 formed of crystalline silicon, include epitaxial grown crystal lumps 185 and 186 each including polycrystals in the same manner as FIGS. 1 to 5, respectively.

Crystallinity of each of the emitter layer 120a and the rear passivation layer 192a is equal to or less than about 10% in the same manner as the crystal lumps 181 and 184. Hence, a loss of carriers resulting from the crystal lumps 185 and 186 is reduced, and thus the efficiency of the solar cell 1a is improved.

The embodiments of the invention may be applied to other types of solar cells as well as the above-described type solar cells. For example, the embodiments of the invention may be applied to a thin film solar cell in which a substrate is formed of a transparent material, such as glass, and a semiconductor material as a thin film is formed on the substrate.

The embodiments of the invention include ones having non-amorphous substrate, a first intrinsic semiconductor on the non-amorphous substrate, a second intrinsic semiconductor on an opposite side of the non-amorphous substrate from the first intrinsic amorphous semiconductor. One or both of the first intrinsic semiconductor and the second intrinsic semiconductor contains a crystal lump, or at least one portion that is crystalline and another portion that is amorphous. The crystallinity of one or both of the first intrinsic semiconductor and the second intrinsic semiconductor may be equal to or less than 30%. An emitter layer or a BSF layer may be formed on one of the first intrinsic semiconductor and the second intrinsic semiconductor or on respective first intrinsic semiconductor and the second intrinsic semiconductor. A crystallinity of the one or both of the first intrinsic semiconductor and the second intrinsic semiconductor varies based on whether how the emitter layer or the BSF layer are formed thereon.

As described above, in the solar cell according the embodiments of the invention, when crystal lumps are grown in amorphous silicon using crystalline silicon as a seed layer, a loss of carriers resulting from the crystal lumps is minimized by controlling crystallinity of amorphous silicon at an optimum value. Accordingly, the efficiency of the solar cell is improved.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
a single crystalline silicon substrate of a first conductive type;
an emitter layer of a second conductive type opposite the first conductive type, the emitter layer forming a hetero junction with the single crystalline silicon substrate and including a first crystalline portion;
a back surface field layer of the first conductive type, the back surface field layer forming a hetero junction with the single crystalline silicon substrate and including a second crystalline portion;
a first electrode portion on the emitter layer; and
a second electrode portion on the back surface field layer,
wherein the back surface field layer has a crystallinity greater than a crystallinity of the emitter layer,
wherein the emitter layer and the back surface field layer are on a back surface of the single crystalline silicon substrate and are spaced apart from each other, and
wherein a first passivation layer is located on the back surface of the single crystalline silicon substrate between the emitter layer and the back surface field layer and is not located between the emitter layer and the back surface of the single crystalline silicon substrate and between the back surface field layer and the back surface of the single crystalline silicon substrate.

2. The solar cell of claim 1, further comprising a second passivation layer including a third crystalline portion on the single crystalline silicon substrate.

3. The solar cell of claim 2, wherein the second passivation layer has a crystallinity equal to or less than 10%.

4. The solar cell of claim 1, wherein the crystallinity of the back surface field layer is equal to or less than 30%.

5. The solar cell of claim 1, wherein the crystallinity of the emitter layer is equal to or less than 10%.

6. The solar cell of claim 2, wherein the first passivation layer includes a fourth crystalline portion.

7. The solar cell of claim 6, wherein the first passivation layer has a crystallinity equal to or less than 10%.

8. The solar cell of claim 1, wherein at least one of the first and second electrode portions comprises a transparent conductive layer and a metal electrode.

* * * * *